United States Patent [19]

Cho

[11] Patent Number: 5,034,820
[45] Date of Patent: Jul. 23, 1991

[54] CHANNEL DISPLAY CIRCUIT FOR DISTINGUISHING THE EXISTENCE OR NONEXISTENCE OF THE SIGNAL AT A SATELLITE-BROADCAST RECEIVER

[75] Inventor: Seong-Jae Cho, Anyang, Rep. of Korea

[73] Assignee: SamSung Electronics Co., Ltd., Suwon, Rep. of Korea

[21] Appl. No.: 375,538

[22] Filed: Jul. 3, 1989

[30] Foreign Application Priority Data

Jul. 4, 1988 [KR] Rep. of Korea .................. 88-8326

[51] Int. Cl.$^5$ .................. H04N 5/50; H04N 9/74; H04N 5/262; H04N 7/18
[52] U.S. Cl. .................. 358/192.1; 358/191.1; 358/22; 358/183; 358/93; 340/715; 343/894
[58] Field of Search .................. 358/188, 192.1, 191.1, 358/183, 22, 903, 174; 455/154; 340/715; 343/894, 766

[56] References Cited

U.S. PATENT DOCUMENTS

| 4,214,273 | 7/1980 | Brown | 358/192.1 |
| 4,349,840 | 9/1982 | Henderson | 358/188 |
| 4,536,797 | 8/1985 | Maturo et al. | 358/192.1 |
| 4,605,968 | 8/1986 | Hayashi | 358/192.1 |

FOREIGN PATENT DOCUMENTS 2033179 5/1980 United Kingdom .................. 343/766

Primary Examiner—John K. Peng
Attorney, Agent, or Firm—Robert E. Bushnell

[57] ABSTRACT

A circuit for distinguishing the existence or non-existence of a signal at a satellite-broadcast receiver. The circuit includes an antenna adjusting part aimed toward the satellite after the satellite signal is tuned using a channel tuning stage driven by the output of a microcomputer. The level of the IF signal is detected by the IF signal AGC amplifier and the IF signal level detector. A video signal detecting stage detects the FM signal of the IF signal AGC amplifier output and the existence or nonexistence of the video signal is determined after audio/video signal processsing, and a channel displaying means, wherein the state of said video detecting part and the antenna position where video signal exists are displayed by on-sceen operations.

12 Claims, 2 Drawing Sheets

CHANNEL DISPLAY CIRCUIT FOR DISTINGUISHING THE EXISTENCE OR NONEXISTENCE OF THE SIGNAL AT A SATELLITE-BROADCAST RECEIVER

BACKGROUND OF THE INVENTION

The present invention relates to a channel display circuit for distinguishing the existence or nonexistence of the signal at a satellite broadcast-receiver.

Generally, a satellite-broadcast receiver receives the satellite signal from a parabola antenna and selects the channel by tuning.

In the past, as shown in FIG. 1 the satellite signal having the channel selected through an channel tuning part 1 is applied to a intermediate-frequency (IF) signal level detector 3 through an IF signal automatic-gain-control amplifier 2(IF signal AGC AMP), and the light emitting diode(LED) is driven by the driver 4 after level detection of an IF signal stating how accurately an antenna is fitted to the satellite signal, is displayed.

But, to find how many channels are occupied by the satellite signal, the channel must be scanned, adjusting the antenna so that the screen appears for a moment on the television(TV) and disappears at once. Also LED driver 4 tunes LEDs on and then turns off at once.

If the screen appears for a moment, there is trouble finding the channel with the screen by up/down operation of channels after the stop of the rotation of the antenna and coming out from the scanning mode. At this time, LEDs are turned on. It is impossible to seek the screen to be displayed shortly without watching TV, the satellite signal is regarded as absent so that the problem passing the satellite without inspection can occur.

SUMMARY OF THE INVENTION

The present invention has been made in consideration of this and has object of providing a channel display circuit for distinguishing existence or nonexistence of the signal and the position of the antenna at the satellite-broadcast receiver, in which the existence or nonexistence of the satellite signal is distingushed automatically by adding the on-screen operation in case of the existence of the satellite signal when searched from channel 1 to channel 24 on the scanning mode after channel-up. This object can be achieved by detecting the level of the satellite signal and controlling the on-screen operation of the TV using a microcomputer(MICOM).

According to the present invention, there is provided a channel display circuit for distinguishing the existence or nonexistence of the signal at a satellite-broadcast receiver which is composed of the antenna adjusting part being toward the satellite and controlling light emitting diode(LED) after the satellite signal is tuned using the channel tuning part which can be driven by the output of MICOM and the specified level of IF signal is detected by the IF signal AGC AMP and the IF signal level detector, the device including; a video signal detecting device, wherein the FM signal is detected among the output of the IF signal AGC AMP, the IF signal level detector and MICOM, and the existence or nonexistence of the video signal is found after audio/video signal processing, and a channel displaying means, wherein the state of said video signal detecting part and the antenna position where the video signal exists are displayed by on-screen operation.

DETAILED DESCRIPTION OF THE INVENTION

The present invention will now be described in more detail with reference of the accompanying drawings.

Figure 1:
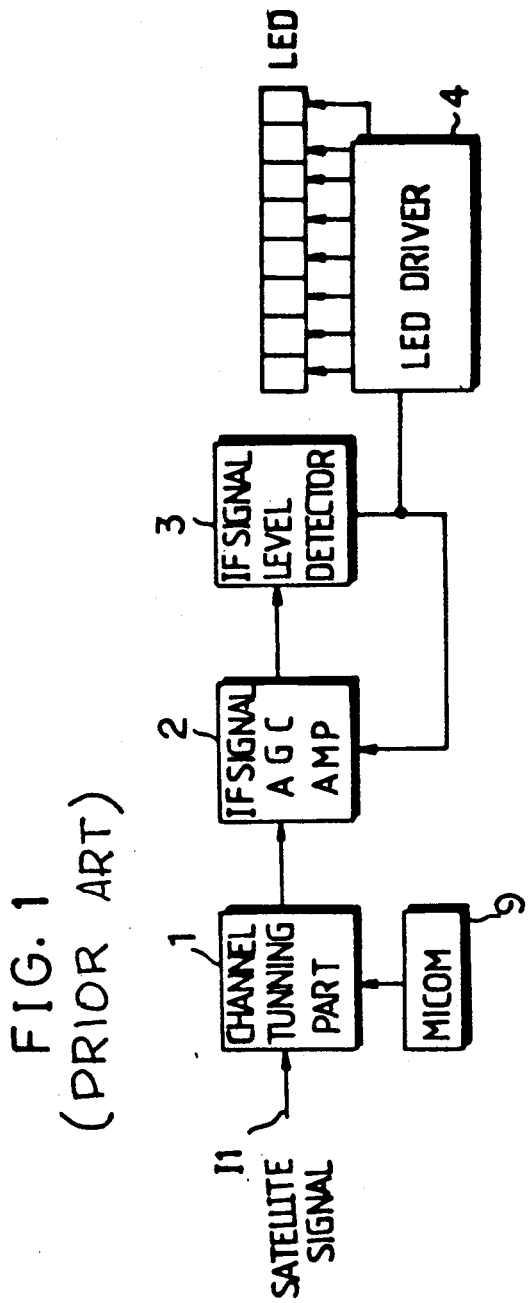
FIG. 1 is a conventional circuit diagram

FIG. 1 is the conventional circuit diagram and is composed as follows: the satellite signal(950-1450 MHZ) applied to input port I1 is tuned by the tuning part 1 driven under control of the MICOM 9, and the IF signal level is detected by the IF signal level detector 3 after passing through the IF signal AGC AMP 2, and how accurately the antenna fits to the satellite signal is displayed by during an LED array through LED driver 4.

By this time, if the IF signal level is lower than the specified level, the lower AGC voltage is fed back and increases the gain of the IF signal AGC AMP 2 so that the level of IF signal is set to the specified level, but if the level is higher than the specified level, the higher voltage is fed back and reduces the gain of the IF signal AGC AMP 2 so that the level of the IF signal is set to the specified level.

That is, if the applied satellite signal has a lower level, then the lower AGC voltage is applied corresponding to the lower level, but if higher, the higher AGC voltage is applied.

If the AGC signal level is lower, the LED driver part 4 turns few LEDS it turns many LEDs on so that how accurately the satellite signal is adjusted at the antenna and the condition of existence or nonexistence of satellite signal can be displayed detected.

Thus, in order to find how many channels are occupied by the satellite signal through this method, the channel must be scanned adjusting the antenna so that all the channels where the video signal exists may be found. If the channel exists, there is trouble to scan the channels up/down after stopping the rotation of the antenna and coming out from scan mode.

Figure 2:
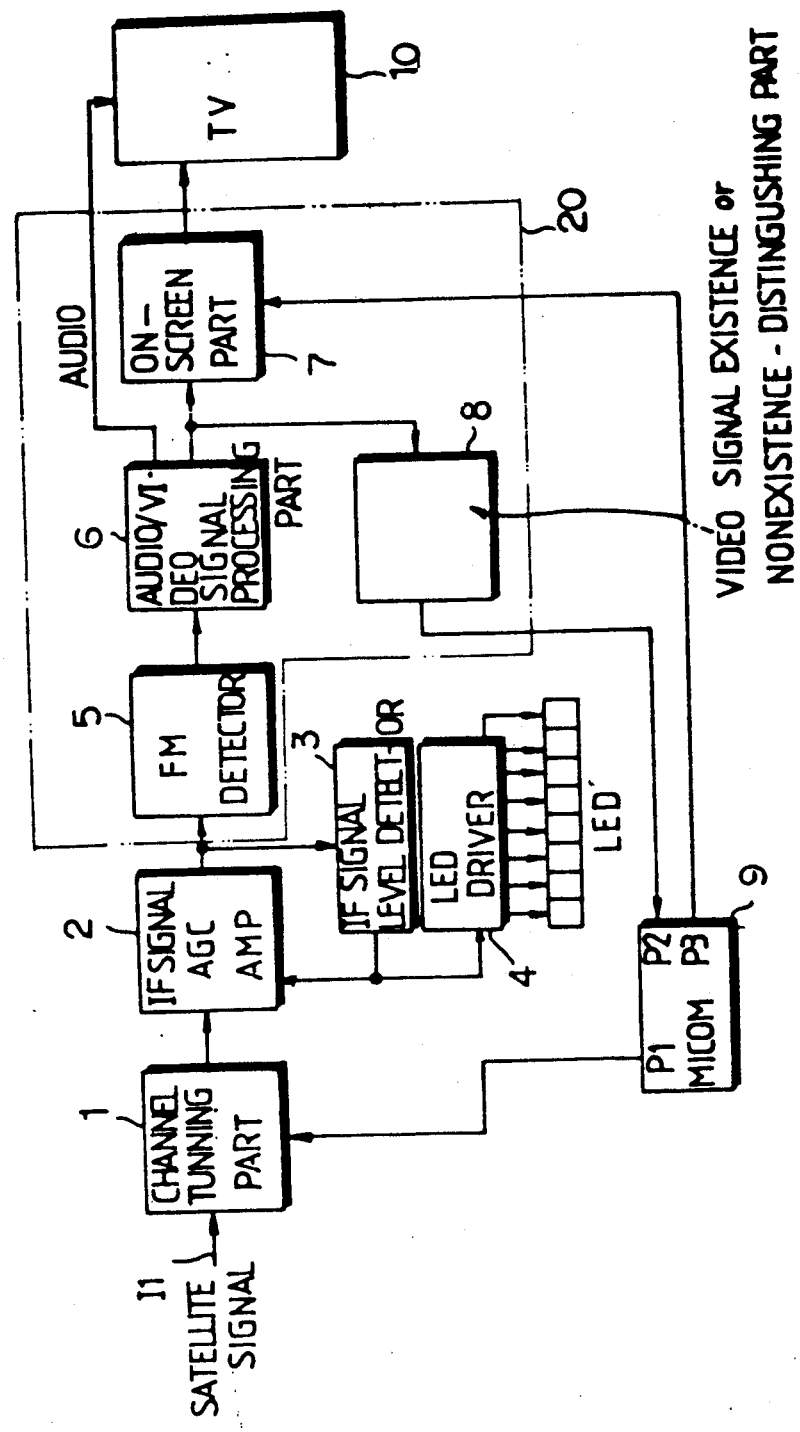
FIG. 2 is a circuit diagram of the present invention

FIG. 2 is the circuit diagram of the present invention and is composed to be operated as follows: the applied satellite signal is detected through the channel tuning part 1, the IF signal AGC AMP 2 and IF signal level detector 3 as shown in FIG. 1, and the existence or nonexistence of the satellite signal and how accurately the antenna is adjusted at the satellite are displayed by controlling LED through the driver 4, but the output of the IF signal AGC AMP 2 is applied to the FM detector 5, and the audio signal is applied to the TV 10 among the outputs of FM detector 5, and the video signal is applied to the video signal existence or nonexistence-distinguishing part 8. And the output is input to the P2 of Micom. Then Micom controls the on-screen part 7. The channel display driver 20 performs the on-screen operation on TV according to the existence or nonexistence of the signal and the antenna position at this time.

To explain the operation effect of the present invention, it follows. In FIG. 2, if the output P1 selects the channel 1 controlling the channel tuning part 1, the level of signal is detected through the IF signal AGC AMP 2 and IF signal level detector 3 after the channel 1 of the satellite signal of the input port I1 applied to the channel tuning part 1 is tuned, the level of signal turns on the LED through the LED driver 4, so that how accurately the antenna is fitted to the satellite is displayed.

Where, the IF signal amplified by the IF signal AGC AMP, to the specified level, is detected through the FM detector 5 and is applied to the audio/video signal-processing part 6, and the audio signal is provided to the speaker of TV 10, and the video signal is applied to the port P2 of MICOM 9 through the video signal existence or nonexistence distinguishing part 8.

The video signal existence or nonexistence distinguishing part 8 provides the H level or L level according to the existence or nonexistence of the video signal to the port P2 of MICOM, and if the video signal exists in channel 1, then the state of the video signal provided from the audio/video signal processing part 6 and the antenna position on this time are displayed as characters in video signal on TV 10 through the on-screen part 7 by the control of the MICOM output P3, so that the existence or nonexistence state in channel 1 and the positions of antenna are displayed.

After the existence or nonexistence of the video signal for channel 1 is found, the MICOM 9 turns sequentially the state of each channel from channel 2 to channel 24 so that the existence or nonexistence of all channels can be found continuously through the on-screen operation.

At this time, the channels in which the signal exist displayed continuously on screen.

Thus, if the video signal exists, the channel state is displayed continuously on TV 10 through the on-screen part 7 although the antenna rotates, so of the problem that the user passing without detection can be prevented.

And, if the antenna stops for a moment and rotates again after a constant time, the channel display character displayed on TV 10 is removed by the control of MICOM output P3 for the on-screen part 7, the characters which represent the nonexistence state of the signal in channels is displayed, and the operation described before is repeated so that the operation for detecting the channel and the position of antenna with satellite are performed.

As mentioned above, the present invention provides the channel display circuit for diplayng the antenna position where a video signal exists and distinguishing the existence or nonexistence of the signal at the satellite-broadcast receiver, in which the channel state of existence or nonexistence and the positions of antenna are displayed by control of MICOM for the channel tuning part and the on-screen part so that the convention problem that the user misses the satellite of broadcasting without detection can be improved and whether what position the satellite is and how many channels have the signal or not can be found at once, and the existence or nonexistence of each channel can be detected and the antenna position where a video signal exists can be detected.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A channel display circuit for distinguishing the existence or nonexistence of a satellite signal at a satellite-broadcast receiver having an antenna adjusting part directed toward a satellite by a light emitting device after the satellite signal is tuned using a channel tuning part signalling from a microcomputer and a specified level of an intermediate frequency signal is detected by an intermediate frequency signal automatic gain control amplifier generating a plurality of intermediate signals and an intermediate frequency signal level detector, the circuit comprises:

video signal detecting means, for detecting an intermediate frequency signal from among the plurality of intermediate signals from the intermediate frequency signal automatic gain control amplifier, and establishing a state indicative of existence or nonexistence of a video signal after audio/video signal processing; and channel display means, wherein the state of said video signal detecting means and a position of the antenna are displayed by on-screen operation under control of said microcomputer.

2. A channel display circuit according to claim 1, wherein the video signal detecting means comprises:

a frequency modulation detector;

an audio/video signal processing part coupled to receive the intermediate frequency signal amplified by said intermediate frequency signal automatic gain control amplifier and passed through the frequency modulation detector to produce audio and video signals; and a video signal existence or nonexistence distinguishing part coupled to receive the video signal produced by the audio/video signal processing part producing a signal delivered to an input port of the microcomputer.

3. A channel display circuit according to claim 1, wherein the channel display means comprises:

an on-screen part driven to provide display signals in response to reception of output signals indicative of said position and of said state from said microcomputer; and television means for displaying said state of the existence or nonexistence of a video signal in a channel and the position of the antenna based upon said display signals from said on-screen part.

4. A channel display circuit according to claim 1, wherein the state of existence or nonexistence of a signal in a channel is displayed by on-screen operation without a light emitting diode driver for turning on the light emitting device.

5. A channel display circuit according to claim 2, wherein the channel display means comprises:

an on-screen part driven to receive output signals indicative of said position and of said state from said microcomputer; and television means for displaying said state of the existence or nonexistence of a video signal in a channel and the position of the antenna based upon said output signals from said on-screen part.

6. A channel display circuit according to the claim 5, wherein the state indicating existence or nonexistence of a signal in a channel is displayed by on-screen operation without a light emitting diode driver for turning on the light emitting device.

7. A channel display circuit for distinguishing the existence or nonexistence of a signal at a satellite-broadcast receiver, comprising:

means for converting a satellite-broadcast signal into an intermediate frequency signal;

a microcomputer for driving said converting means;

an intermediate frequency signal automatic gain control amplifier for providing amplified signals by amplifying the intermediate frequency signal;

an intermediate frequency level detector for detecting the level of the amplified signals;

a light emitting device;

means for driving said light emitting device based on the strength of a signal received from said intermediate frequency signal automatic gain control amplifier;

video signal detecting means for detecting a frequency modulated signal from among said amplified signals, intermediate frequency signal level detector and microcomputer and providing an indication of a state of existence or nonexistence of a video signal after audio/video signal processing; and channel display means, wherein the state of said video signal detecting and position of the antenna are displayed by on-screen operation under control of said microcomputer.

8. A channel display circuit according to claim 7, wherein the video signal detecting means comprises:

a frequency modulation detector;

an audio/video signal processing part coupled to receive the intermediate frequency signal amplified by said intermediate frequency signal automatic gain control amplifier and passed through the frequency modulation detector to produce audio and video signals; and a video signal existence or nonexistence distinguishing part coupled to receive the video signal produced by the audio/video signal processing part and produce a signal based on the state of the video signal, to be delivered to an input port of the microcomputer.

9. A channel display circuit according to claim 7, wherein the channel display means comprises:

on screen means driven by to receive output signals indicative of said position and of said state from said microcomputer; and television means for displaying the state of existence or nonexistence of a signal in a video channel and the position of an antenna based upon said output signals from said on-screen part.

10. A channel display circuit according to claim 7, wherein the state of existence or nonexistence of a signal in a channel is displayed by on-screen operation without a light emitting diode driver for turning on the light emitting device.

11. A channel display circuit for distinguishing the existence or nonexistence of a signal at a satellite-broadcast receiver, comprising:

means for converting a satellite-broadcast signal into a received intermediate frequency signal;

a microcomputer for driving said converting means;

an intermediate frequency signal automatic gain control amplifier for amplifying the intermediate frequency signal;

an intermediate frequency level detector for detecting the level of the amplified signals;

a light emitting device;

a driver to turn on said light emitting device on the basis of the strength of the signal received from said intermediate frequency signal automatic gain control amplifier;

video signal detecting means, comprising:

a frequency modulation detecting means for detecting whether the intermediate frequency signal is amplified to a specified value by said intermediate frequency signal automatic gain control amplifier;

an audio/video signal processing part for receiving the intermediate frequency signal from said intermediate frequency signal automatic gain control amplifier through said frequency modulation detector and processing said signal; and a video signal detecting means for indicating a state of existence or nonexistence of a video signal from said audio/video signal processing part and delivering a high or low level signal to said microcomputer depending on the existence or nonexistence of a video signal;

and channel display means, comprising:

a television receiver; and on-screen means, driven by said microcomputer, for displaying the state of the existence or nonexistence of the intermediate frequency signal and position of an antenna to receive said satellite-broadcast signal on a television receiver under control of said microcomputer.

12. A method of displaying the existence or nonexistence of a satellite signal at a satellite broadcast receiver, comprising the steps of:

tuning a channel for the satellite signal;

detecting an applied satellite signal having a video signal component;

detecting a signal level, and displaying the signal level of each channel as the channels are changed, showing the accuracy of fit of an antenna to a satellite; and displaying the state of existence or nonexistence of the video signal component and position of an antenna receiving said satellite signal, for each channel.

* * * * *

UNITED STATES PATENT AND TRADEMARK OFFICE
CERTIFICATE OF CORRECTION

PATENT NO. : 5,034,820

DATED : July 23, 1991

INVENTOR(S) : Seong-Jae CHO

It is certified that error appears in the above-identified patent and that said Letters Patent is hereby corrected as shown below:

Column 1, line 15, change "an " to --a--;
         line 16, change "an " to --a--;
         line 26, change "tunes" to --turns--;
         line 34, insert --of-- after "problem";
         line 40, insert --an-- after "has";
         line 60, change ";" to --:--;
         line 66, change "means" to --device 30--, and change "said" to --the--;

Column 2, line 17, delete "to";
         line 18, change "during" to --driving--;
         line 32, delete "part";
         line 33, insert --on, and if higher, --after "few LEDs";
         line 36, delete "detected";
         line 41&42, change "to scan the channels up/down" to --finding the channel with the screen by up/down operation of channels--;

Column 3, line 28, insert --and the positions of antenna are --before "displayed";
         line 31, change "of" to --that --;
         line 32, change "that" to --of--;
         line 44, delete "displaying";
         line 50, change "convention" to --conventional--;

UNITED STATES PATENT AND TRADEMARK OFFICE
CERTIFICATE OF CORRECTION

PATENT NO. : 5,034,820

DATED : July 23, 1991

INVENTOR(S) : Seong-Jae Cho

It is certified that error appears in the above-identified patent and that said Letters Patent is hereby corrected as shown below:

Column 3, line 59, insert --the-- after "of".

Signed and Sealed this

Eighth Day of December, 1992

Attest:

DOUGLAS B. COMER

Attesting Officer

Acting Commissioner of Patents and Trademarks